United States Patent
Deokar et al.

(10) Patent No.: US 9,784,773 B2
(45) Date of Patent: Oct. 10, 2017

(54) INTELLIGENT SENSOR NETWORK IN A LOAD CENTER

(71) Applicant: SCHNEIDER ELECTRIC IT CORPORATION, West Kingston, RI (US)

(72) Inventors: Vishwas Mohaniraj Deokar, Acton, MA (US); Namwook Paik, Acton, MA (US); Jeffrey Steven Young, Billerica, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 15/033,973

(22) PCT Filed: Nov. 6, 2013

(86) PCT No.: PCT/US2013/068679
§ 371 (c)(1),
(2) Date: May 3, 2016

(87) PCT Pub. No.: WO2015/069232
PCT Pub. Date: May 14, 2015

(65) Prior Publication Data
US 2016/0274153 A1 Sep. 22, 2016

(51) Int. Cl.
*G01R 15/18* (2006.01)
*G01R 19/25* (2006.01)
(Continued)

(52) U.S. Cl.
CPC ....... *G01R 19/2513* (2013.01); *G01R 15/142* (2013.01); *H01F 38/28* (2013.01);
(Continued)

(58) Field of Classification Search
CPC .... G01R 15/18; G01R 15/142; G01R 15/186; G01R 19/2513; H01R 13/58; H01F 38/28
See application file for complete search history.

(56) References Cited

U.S. PATENT DOCUMENTS

| | | | |
|---|---|---|---|
| 6,788,508 B2 * | 9/2004 | Papallo, Jr. | H01H 71/123 361/64 |
| 8,570,715 B2 | 10/2013 | Cook | |
| 8,660,810 B2 | 2/2014 | Deokar et al. | |
| 8,666,685 B2 | 3/2014 | Paik et al. | |
| 8,700,747 B2 | 4/2014 | Spitaels et al. | |
| 8,787,372 B2 | 7/2014 | Cohen et al. | |
| 9,146,259 B2 | 9/2015 | Blake et al. | |
| 9,267,826 B2 | 2/2016 | Paik et al. | |
| 2010/0235122 A1 * | 9/2010 | McCrea | G01R 21/06 702/64 |

(Continued)

FOREIGN PATENT DOCUMENTS

WO 2013/162536 A1 10/2013

OTHER PUBLICATIONS

Notification of Transmittal of the International Search Report and the Written Opinion of the International Searching Authority from corresponding PCT/US2013/068679 dated Apr. 10, 2014.

*Primary Examiner* — Minh N Tang
(74) *Attorney, Agent, or Firm* — Lando & Anastasi, LLP

(57) ABSTRACT

According to one aspect, embodiments of the invention provide a system for monitoring a load center including a plurality of current sensors, a communication bus, a plurality of sensor circuits, a power module configured to be coupled to a load center input line and to receive input AC power from the input line, a collector, and a cable configured to be coupled between the power module and the collector, wherein the power module is further configured to provide power to the plurality of sensor circuits via the communication bus, provide power to the collector via the cable, measure at least one of voltage, frequency and phase of input AC power and provide signals related to the measured voltage, frequency or phase to the collector via the cable, receive current measurement signals from the plurality of sensor circuits and provide the received current measurement signals to the collector via the cable.

18 Claims, 11 Drawing Sheets

(51) Int. Cl.
*H02J 13/00* (2006.01)
*G01R 15/14* (2006.01)
*H01F 38/28* (2006.01)
*H01R 9/00* (2006.01)
*H01R 13/58* (2006.01)
*H02J 3/02* (2006.01)
*H02M 7/04* (2006.01)
*H01R 4/24* (2006.01)
*H01R 25/14* (2006.01)
*G01R 1/22* (2006.01)

(52) U.S. Cl.
CPC ............... *H01R 9/00* (2013.01); *H01R 13/58* (2013.01); *H02J 3/02* (2013.01); *H02J 13/0055* (2013.01); *H02J 13/0093* (2013.01); *H02M 7/04* (2013.01); *G01R 1/22* (2013.01); *H01R 4/2433* (2013.01); *H01R 25/142* (2013.01); *Y02E 60/727* (2013.01); *Y04S 10/26* (2013.01)

(56) References Cited

U.S. PATENT DOCUMENTS

| | | |
|---|---|---|
| 2010/0328849 A1 | 12/2010 | Ewing et al. |
| 2015/0102800 A1 | 4/2015 | Deokar et al. |
| 2015/0102803 A1 | 4/2015 | Young et al. |
| 2015/0331024 A1 | 11/2015 | Bruel et al. |

* cited by examiner

INTELLIGENT SENSOR NETWORK IN A LOAD CENTER

CROSS-REFERENCE TO RELATED APPLICATIONS

This application is a U.S. National Stage Application under 35 U.S.C. §371 of International Application No. PCT/US2013/068679, filed Nov. 6, 2013, titled INTELLIGENT SENSOR NETWORK IN A LOAD CENTER, which is hereby incorporated herein by reference in its entirety.

BACKGROUND OF INVENTION

Field of the Invention

At least one example in accordance with the present invention relates generally to systems and methods for monitoring a load center for current, voltage, power and/or energy usage.

Discussion of Related Art

A load center or panelboard is a component of an electrical supply system which divides an electrical power feed from a power line into different subsidiary circuit branches. Each subsidiary circuit branch may be connected to a different load. Thus, by dividing the electrical power feed into subsidiary circuit branches, the load center may allow a user to individually control and monitor the current, power and energy usage of each load.

Current sensors are commonly used to monitor activity of a load center. For example, Current Transformers (CT) are commonly used to monitor current, power and/or energy consumption in a subsidiary or main branch of a load center. A CT may be used to measure current in a branch by producing a reduced current signal, proportionate to the current in the branch, which may be further manipulated and measured. For example, a CT coupled to a branch of a load center may produce a reduced current AC signal, proportionate to the magnitude of AC current in the branch. The reduced current AC signal may then either be measured directly or converted to a DC signal and then measured. Based on the signal received, the level of current in the subsidiary branch may be determined.

SUMMARY OF THE INVENTION

Aspects in accord with the present invention are directed to a system for monitoring a plurality of circuit branches coupled to an input line within a load center having a housing, the system comprising a plurality of current sensors, each configured to be coupled to at least one of the plurality of circuit branches and to produce a signal having a level related to a current level of the one of the plurality of circuit branches, a communication bus, a plurality of sensor circuits, each coupled to an associated one of the plurality of current sensors and configured to be coupled to the communication bus, wherein each one of the plurality of sensor circuits is configured to convert the signal from the associated one of the plurality of current sensors to a digital current measurement signal and provide the digital current measurement signal to the communication bus, a power module configured to be coupled to the input line and the communication bus and to receive input AC power from the input line, a collector, and a cable configured to be coupled between the power module and the collector, wherein the power module is further configured to provide power to the plurality of sensor circuits via the communication bus, provide power to the collector via the cable, measure at least one of voltage, frequency and phase of the input AC power and provide signals related to the measured voltage, frequency or phase of the input AC power to the collector via the cable, receive the digital current measurement signals from the plurality of sensor circuits and provide the received digital current measurement signals to the collector via the cable.

According to one embodiment, the power module is further configured to convert the received input AC power into DC power, provide the DC power to the plurality of sensor circuits via the communication bus, and provide the DC power to the collector via the cable.

According to another embodiment, the collector is further configured to be located external the housing of the load center. In one embodiment, the system further comprises a terminal configured to pass through the housing of the load center and to allow the cable to pass through the housing of the load center.

According to one embodiment, the collector is configured to receive the digital current measurement signals and the signals related to the measured voltage, frequency or phase of the input AC power from the power module via the cable and calculate at least one of power and energy parameters of one of the plurality of circuit branches based on the digital current measurement signals and the signals related to the measured voltage, frequency or phase of the input AC power.

According to another embodiment, the power module is further configured to calculate at least one of power and energy parameters of one of the plurality of circuit branches based on the digital current measurement signals and the measured voltage, frequency or phase of the input AC power.

According to one embodiment, the power module comprises an analog interface configured to be coupled to the input line, a digital interface configured to be coupled to the communication bus, a digital output configured to be coupled to the cable, and an AC/DC converter coupled to the analog interface, the digital interface and the digital output and configured to receive the input AC power from the input line, convert the received input AC power into the DC power having a desired DC voltage level, and provide the DC power to the communication bus via the digital interface and to the cable via the digital output. In one embodiment, the power module further comprises a voltage sense circuit coupled to the analog interface, the digital interface and the digital output and configured to receive the input AC power from the input line, measure at least one of voltage, frequency and phase of the input AC power and provide signals related to the measured voltage, frequency or phase of the input AC power to the cable. In another embodiment, the system further comprises an isolation circuit configured to be coupled to the digital output and configured to prevent high voltage signals from passing between the power module and the cable.

According to another embodiment, the digital interface comprises a connector configured to couple with a mating connector at a terminus of the communication bus. In one embodiment, the analog interface comprises at least one of a terminal block configured to receive the input line and a mechanical strain relief configured to secure the input line to the power module. In another embodiment, the digital output comprises a mechanical strain relief configured to secure the cable to the power module, and wherein the cable is ruggedized.

According to one embodiment, the plurality of sensor circuits are further configured to utilize a communication protocol to communicate with the power module over the communication bus and the power module is further configured to utilize the communication protocol to communicate with the collector over the cable. In another embodiment, the power module is further configured to synchronize, via the communication bus, voltage measurements performed by the power module with current measurements performed by at least one of the plurality of sensor circuits.

Another aspect in accord with the present invention is directed to a method for monitoring a plurality of circuit branches coupled to a power line within a load center having a housing, the method comprising coupling a current transformer to each one of the plurality of circuit branches, coupling a plurality of sensor circuits to a communication bus, wherein each of the sensor circuits is coupled to one of the current transformers, coupling a power module to the communication bus and a cable, coupling a collector to the cable, generating, in each current transformer, a reference signal having a level related to a current level of one of the plurality of circuit branches, converting, with each of the plurality of sensor circuits, a reference signal from a corresponding current transformer to a digital current measurement signal and providing the digital current measurement signal to the communication bus, receiving, with the power module, the digital current measurement signal from each sensor circuit via the communication bus, receiving, with the power module, input AC power from the power line, measuring, with the power module, at least one of voltage, frequency, and phase of the input AC power, providing, with the power module, power to the plurality of sensor circuits via the communication bus, and providing, with the power module, power, the received digital current measurement signals from the plurality of sensor circuits, and signals related to the measured at least one of voltage, frequency, and phase of the input AC power to the collector via the cable.

According to one embodiment, the method further comprises converting, with the power module, the received input AC power into DC power, providing power to the plurality of sensor circuits includes providing, with the power module, the DC power to the plurality of sensor circuits via the communication bus; and providing power, the received digital current measurement signals from the plurality of sensor circuits, and signals related to the measured at least one of voltage, frequency, and phase of the input AC power to the collector via the cable includes providing, with the power module, the DC power, the received digital current measurement signals from the plurality of sensor circuits, and signals related to the measured at least one of voltage, frequency, and phase of the input AC power to the collector via the cable.

According to another embodiment, the power module is located within the housing of the load center and the collector is located external the housing of the load center, and wherein the method further comprises threading the cable through a terminal of the housing, the terminal configured to allow the cable to pass through the housing.

According to one embodiment, the method further comprises receiving, with the collector, the digital current measurement signals and the signals related to the measured voltage, frequency or phase of the input AC power from the power module via the cable, and calculating at least one of power and energy parameters of one of the plurality of circuit branches based on the digital current measurement signals and the signals related to the measured voltage, frequency or phase of the input AC power.

One aspect of the present invention is directed to a system for monitoring a plurality of circuit branches coupled to an input line within a housing of a load center, the system comprising a plurality of current sensors, each configured to be coupled to at least one of the plurality of circuit branches and to produce a signal having a level related to a current level of the one of the plurality of circuit branches, a communication bus, a plurality of sensor circuits, each coupled to an associated one of the plurality of current sensors and configured to be coupled to the communication bus, wherein each one of the plurality of sensor circuits is configured to convert the signal from the associated one of the plurality of current sensors to a digital current measurement signal and provide the digital current measurement signal to the communication bus, a collector located external the housing, and means for measuring at least one of voltage, phase, and frequency of input AC power on the input line, converting the input AC power to DC power; and providing signals related to the at least one of voltage, phase, and frequency of input AC power, the digital current measurement signals from the plurality of sensor circuits, and the DC power to the collector via a single cable.

According to one embodiment, the system further comprises means for preventing high voltage signals from being provided to the single cable.

BRIEF DESCRIPTION OF DRAWINGS

The accompanying drawings are not intended to be drawn to scale. In the drawings, each identical or nearly identical component that is illustrated in various FIGs. is represented by a like numeral. For purposes of clarity, not every component may be labeled in every drawing. In the drawings.

DETAILED DESCRIPTION

Figure 1:
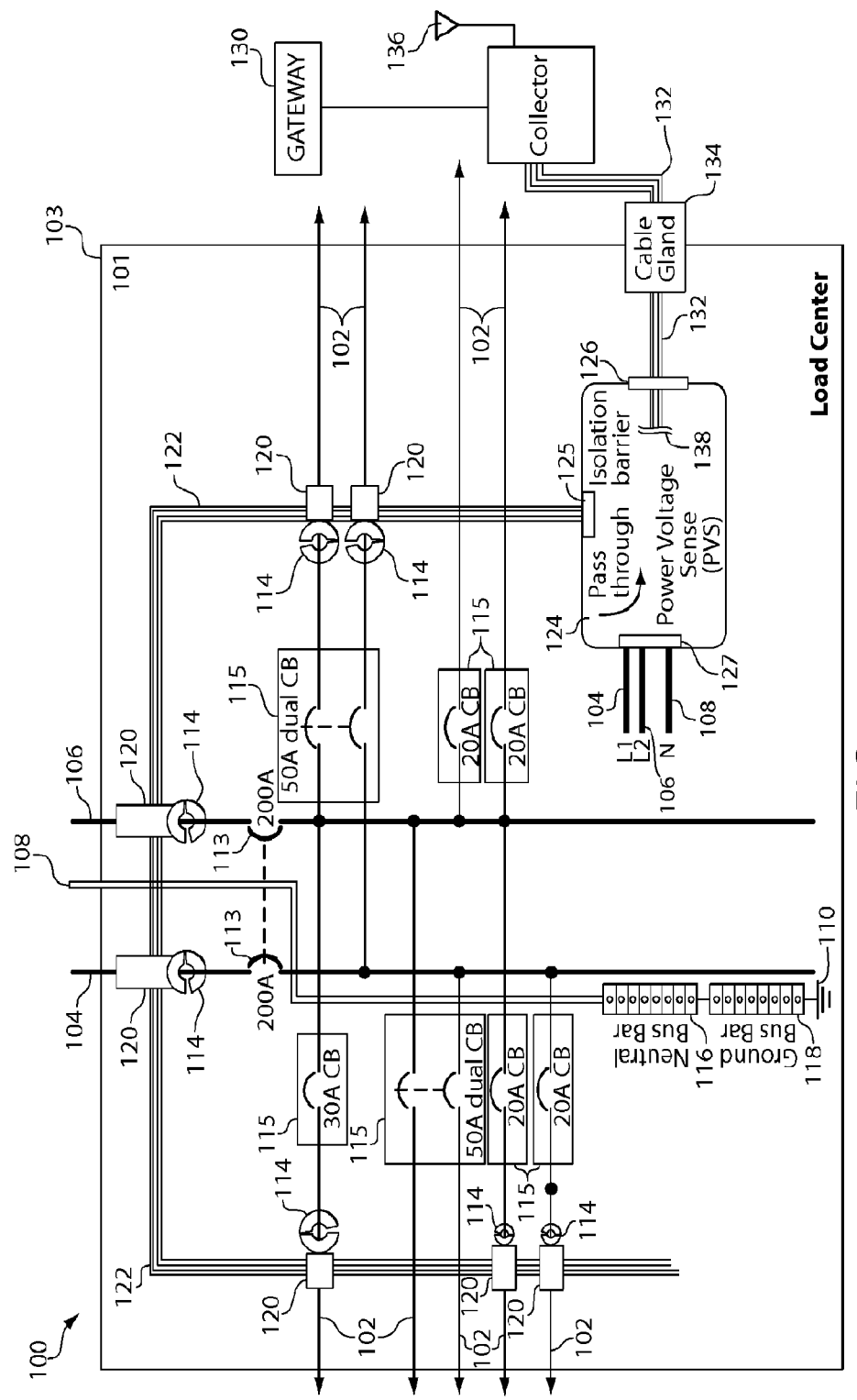
FIG. 1 is a circuit diagram of a load center in accordance with aspects of the present invention.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, CT's may be utilized with a load center of an electrical supply system to monitor circuit branches and assist in providing efficient energy management. For instance, CT's may be coupled to circuit branches inside or outside of a panelboard or load center. However, multiple challenges with mounting CT's in a load center may arise as electrical supply systems grow in size and complexity.

Existing methods and systems typically rely on a system of individual CT's, each connected to a main controller and measurement unit in a "hub and spoke" topology. In such a system, each CT requires dedicated cabling connecting it to the main controller and its measurement unit, so that the number of cables or wires increases linearly with the number of sensors. In addition, some jurisdictions have regulatory requirements on the amount of "gutter space" (i.e., space within the panelboard free of wiring and other electronic devices) available within a panelboard. Therefore, as the number of CT's increases, the amount of cabling and circuitry within a panelboard may become difficult to manage and violate regulatory requirements. In some instances it may even be difficult to physically place all of the desired CT's and corresponding circuitry within the load center, and due to the complexity of such a load center; installation, expansion and maintenance may also be expensive, difficult and even hazardous.

Accordingly, at least some embodiments described herein provide a relatively small, less complex and more manageable method and system for utilizing CT's to monitor circuit branches of a load center.

FIG. 1 shows a system 100 for monitoring subsidiary circuit branches 102 of a load center 101 according to one embodiment of the current invention. The load center 101 includes a housing 103. Within the housing 103, the load center 101 includes a first input power line 104, a second input power line 106, a plurality of circuit branches 102, a neutral line 108, and a ground connection 110.

The first and second input power lines 104, 106 are each configured to be coupled to an external power source (e.g., a utility power system). Each one of the plurality of circuit branches 102 is configured to be coupled between one of the input power lines 104, 106 and an external load (e.g., an appliance, a power outlet, a light etc.). According to one embodiment, each one of the input power lines 104, 106 includes a circuit breaker 113 coupled between the input power line 104, 106 and circuit branches 102. According to another embodiment, each one of the plurality of circuit branches 102 includes a circuit breaker 115 coupled between the input power line 104, 106 and an external load. In one embodiment, the current rating of each of the circuit breakers 113, 115 may be configured based on the power required by the external load to which the circuit breakers 113, 115 associated circuit branch 102 is coupled. The neutral line 108 is coupled to the ground connection 110. According to one embodiment, the neutral line is coupled to the ground connection 110 via a neutral bus bar 116. According to another embodiment, the ground connection 110 is coupled to the neutral line 108 via a ground bus bar 118.

The system 100 includes a plurality of Current Transformers (CT) 114, a plurality of smart sensor circuits 120, a communication bus 122, a Power Voltage Sense (PVS) 124, a collector 128, and a gateway 130.

Each one of the plurality of CT's 114 is coupled to at least one of the plurality of circuit branches 102 within the load center 101. According to one embodiment, CT's 114 may also be coupled to each input line 104, 106 within the load center 101. According to one embodiment, each CT 114 encompasses a corresponding circuit branch 102 or input line 104, 106. Each one of the plurality of CT's is also coupled to a corresponding smart sensor circuit 120. Each smart sensor circuit 120 is coupled to the communication bus 122 within the load center 101. According to one embodiment, the communication bus 122 includes a plurality of wires. For example, in one embodiment, the communication bus 122 is a ribbon cable including 4 wires (a power line, a return line, D+ differential pair line, D− differential pair line); however, in other embodiments, the communication bus 122 may include any number and/or type of wires.

Each smart sensor circuit 120 is connected to the communication bus 122 so that each smart sensor circuit 120 is in electrical communication with the PVS 124 within the load center 101. In one embodiment, each smart sensor circuit 120 is clamped onto the communication bus 122. For example, in one embodiment, electrical contacts of a smart sensor circuit 120 are pressed onto the communication bus 122 so that the electrical contacts pierce an insulation layer of the communication bus 122 and become electrically coupled to appropriate conductors within the communication bus 122. In other embodiments, the smart sensor circuits 120 may be coupled differently to the communication bus 122. For example, according to one embodiment, the smart sensor circuits 120 may be coupled to the communication bus 122 via a bus bar or daisy chained connectors. According to another embodiment, each smart sensor circuit 120 is connected to the communication bus 122 (and coupled to a circuit branch 102) as described in U.S. patent application Ser. No. 13/089,787 entitled "SMART CURRENT TRANSFORMERS", filed on Apr. 19, 2011, which is herein incorporated by reference in its entirety. The connection of smart sensor circuits 120 to the communication bus 122 is discussed in greater detail below.

The PVS 124 includes a digital interface 125, an analog interface 127, and a digital output 126. The communication bus 122 is coupled to the digital interface 125. The analog interface 127 is coupled to the input power lines 104, 106 and the neutral line 108. According to one embodiment, the analog interface 127 is coupled directly to the input power lines 104, 106 and the neutral line 108. According to another embodiment, the analog interface 127 is coupled to the input power lines 104, 106 via at least one circuit branch 102. According to one embodiment, at least one smart sensor circuit is coupled directly to the analog interface 127.

The digital output 126 of the PVS 124 is coupled to a cable 132. According to one embodiment, the cable 132 includes a plurality of wires. For example, in one embodiment, the cable 132 is a ribbon cable including 4 wires (a power line, a return line, D+ differential pair line, D− differential pair line); however, in other embodiments, the cable 132 may include any number and/or type of wires. The cable 132 is coupled between the digital output 126 of the PVS 124 (within the load center 101) to the collector 128

(external the load center 101) via a conduit 134. The conduit 134 allows the cable 132 to pass through the housing 103. According to one embodiment, the conduit 134 is a cable gland; however, in other embodiments, the conduit 134 may be any type of conduit that allows the cable 132 to pass through the housing 102 of the load center 101. The collector 128 is also coupled to the gateway 130.

AC power is provided from an external source (e.g., a utility power system) to the input lines 104, 106. AC power from the input lines 104, 106 is provided to each of the external loads, via the circuit branches 102. The circuit breakers 113 are configured to automatically open and prevent current in an input line 104, 106 if an overload or short circuit is detected in the input line 104, 106. The circuit breakers 115 are configured to automatically open and prevent current in a circuit branch 102 if an overload or short circuit is detected in the circuit branch 102.

The PVS 124 receives AC power from the input lines 104, 106, converts the received AC power into DC power having a desired DC voltage level and provides the converted DC power to the communication bus 122 (via the digital interface 125) and the cable 132 (via the digital output 126) to power the smart sensor circuits 120 and the collector 128 respectively. According to one embodiment, the desired DC voltage level is a low voltage DC voltage level; however, in other embodiments, the PVS 124 may be configured to generate DC power having any desired DC voltage level.

In addition to acting as a power supply for the smart sensor circuits 120 and the collector 128, the PVS 124 also measures the AC voltage, frequency and/or phase of the AC power received from the input lines 104, 106. In one embodiment, the PVS 124 provides digital signals related to the measured AC voltage, frequency and/or phase information to the collector 128 via the cable 132. In another embodiment, the PVS 124 communicates information related to the measured AC voltage, frequency and/or phase of the received AC power to the smart sensor circuits 120, via the communication bus 122. For example, in one embodiment, the PVS 124 transmits phase information of the received AC power to the smart sensor circuits 120 so that measurements by the PVS 124 may be synchronized with measurements by the smart sensor circuits 120. The synchronization of the PVS 124 with the smart sensor circuits 120 will be discussed in greater detail below. According to one embodiment, the PVS 124 is also capable of receiving power from a battery.

AC current passing through a circuit branch 102 or input line 104, 106 induces a proportionate AC current in its associated CT 114 which encompasses the circuit branch 102 or input line 104, 106. According to one embodiment, where a CT 114 may be coupled to multiple circuit branches 102, an AC current proportionate to the combined current in the multiple circuit branches is induced in the CT 114 which encompasses the multiple circuit branches.

The smart sensor circuit 120 coupled to the CT 114 converts the proportionate AC current from the CT 114 into a digital value and then transmits the digital value, over the communication bus 122 to the PVS 124. In addition, according to one embodiment, the smart sensor circuits 120 may be configured to utilize information related to the voltage, frequency and/or phase of the input AC power received from the PVS 124 over the communication bus 122. For example, in one embodiment, a smart sensor circuit 120 utilizes phase information received from the PVS 124 to synchronize operation with the PVS 124 such that current measurements performed by the smart sensor circuits 120 are synchronized with voltage measurements made by the PVS 124.

In one embodiment, in addition to transmitting digital signals related to the measured AC voltage, frequency and/or phase information of the received AC power to the collector 128 via the cable 132 (as discussed above), the PVS 124 also passes the digital current signals received from the smart sensor circuits 120 (via the communication bus 122) to the collector 128 via the cable 132. In another embodiment, the PVS 124 utilizes the measured AC voltage, frequency, and/or phase information and the digital current signals received from the smart sensor circuits 120 to calculate power and energy parameters such as RMS current, true and apparent power, and power factor of the circuit branch 102 or input line 104, 106. These calculated parameters may be transmitted by the PVS 124 to the collector 128 via the cable 132.

The digital signals related to the measured AC voltage, frequency and/or phase information of the received AC power, digital current signals from the smart sensor circuits 120 (received via the communication bus 122), and/or signals related to power and energy parameters calculated by the PVS 124 are compatible (e.g., utilize the same communication protocol) such that each type of signal is transmitted to the collector 128 by the PVS 124 via the same single cable 132.

According to one embodiment, the PVS 124 also includes an isolation circuit 138 coupled to the digital output 126 and configured to provide isolation between the components of the system 100 internal to the load center 101 (e.g., the smart sensor circuits 120 and the input lines 104, 106) from components of the system 100 external to the load center 101 (e.g., the collector 128). According to one embodiment, the isolation circuit 138 is configured to prevent high voltage signals from passing from the PVS 124 to the cable 132.

In one embodiment, the collector 128 utilizes current, voltage, frequency and/or phase information received from the PVS 124 to calculate power and energy parameters such as RMS current, true and apparent power, and power factor of the circuit branch 102 or input line 104, 106. This information may also be transmitted by the collector 128 to an external client (e.g., a web server, in-home display, internet gateway etc.) via a wireless RF interface 136 (e.g., a Zigbee RF interface) or a wired gateway 130 to assist in power management of the load center 101 and to assist in power management and control of a residence or other facility containing the system 100. The PVS 124 may also transmit current, voltage, power and/or energy information to an external client via a different type of wired connection or a different type of wireless connection.

By including a single communication bus 122 to which all smart sensor circuits 120 are coupled, a relatively small, less complex and more manageable method and system for utilizing a plurality of CT's 114 to monitor circuit branches 102 of a load center 101 is provided. Also, by utilizing a separate PVS module 124 that is integrated with the other smart sensor circuits 120 in the system 100 to generate DC source power and measure input voltage, frequency and/or phase, current information from the smart sensor circuits 120, input voltage, frequency and/or phase information, calculated power and energy parameters, and the DC source power from the PVS 124 may all be provided to the collector 128 (external the load center 101) via the same single cable 134. In addition, by locating the collector 128 external the load center 101 and preventing high voltage signals from passing from the PVS 124 to the cable 132, potential interference due to wireless communications by the collector 128 may be reduced, product safety of the system 100 may be improved, and regulatory restrictions on the system 100 may be reduced.

Figure 2A:
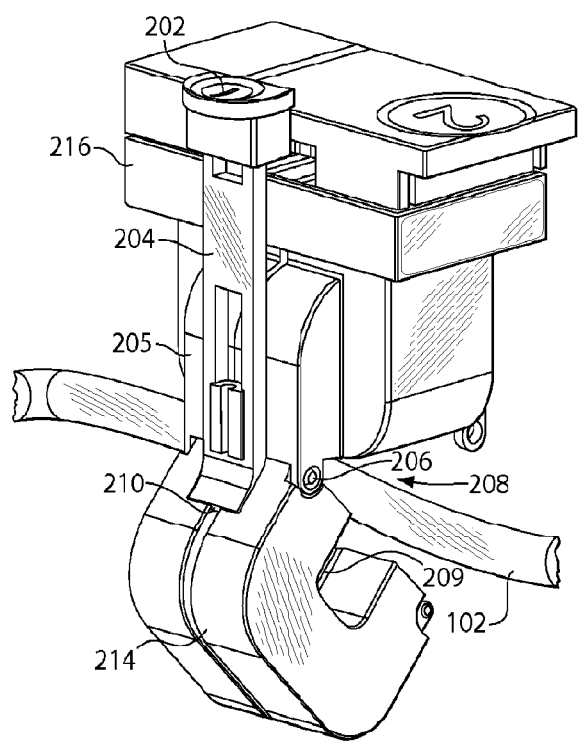
FIG. 2A is a schematic diagram of a smart CT prior to being coupled to a circuit branch in accordance with aspects of the present invention.
Figure 2B:
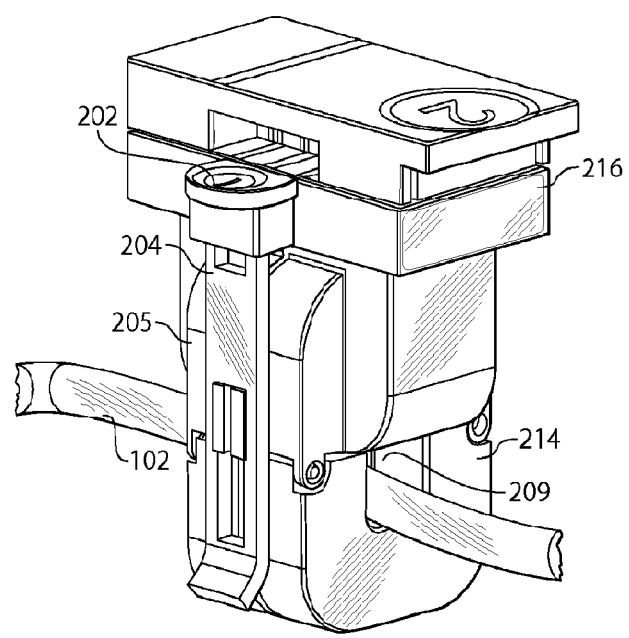
FIG. 2B is a schematic diagram of a smart CT after being coupled to a circuit branch in accordance with aspects of the present invention.

FIGS. 2A and 2B illustrate one embodiment of a process of coupling a CT 114 to a circuit branch 102. A housing 205 includes a CT 114 and a smart sensor circuit 120 enclosed therein. In one embodiment, a first portion 214 of the housing 205 includes a CT 114 and a second portion 216 includes a smart sensor circuit 120. FIG. 2A illustrates the first portion 214 prior to being coupled to a circuit branch 102 and FIG. 2B illustrates the first portion 214 after being coupled to a circuit branch 102.

The first portion 214 is coupled to the second portion 216 via a hinge 206. The second portion 216 includes a button 202 coupled to a lever 204. Prior to the first portion 214 being coupled to the circuit branch 102, the lever 114 is in an upward position, allowing the first portion 214 to swing away from the second portion 216 and create an opening 208 by which a circuit branch 102 may be inserted. When connection to a circuit branch 102 is desired, a user may configure the first portion 214 so that the circuit branch 102 is inserted through the opening 208 into an interior chamber 209. The user may then press down on the button 202, causing the lever 204 to move in a downwards direction. The lever 204 presses against an outside portion 210 of the first portion 214, causing the first portion 214 to swing towards the second portion 216 and capture the circuit branch 102 within the interior chamber 209 of the first portion 214. According to other embodiments, the first portion 214 may be connected to the circuit branch 102 differently. For example, the first portion 214 may be manually placed around the circuit branch 102. As discussed above, after the circuit branch 102 is encompassed by the first portion 214 (and hence also the CT 114), an AC current in the circuit branch 102 will produce a proportionate AC current within the CT 114.

Figure 3A:
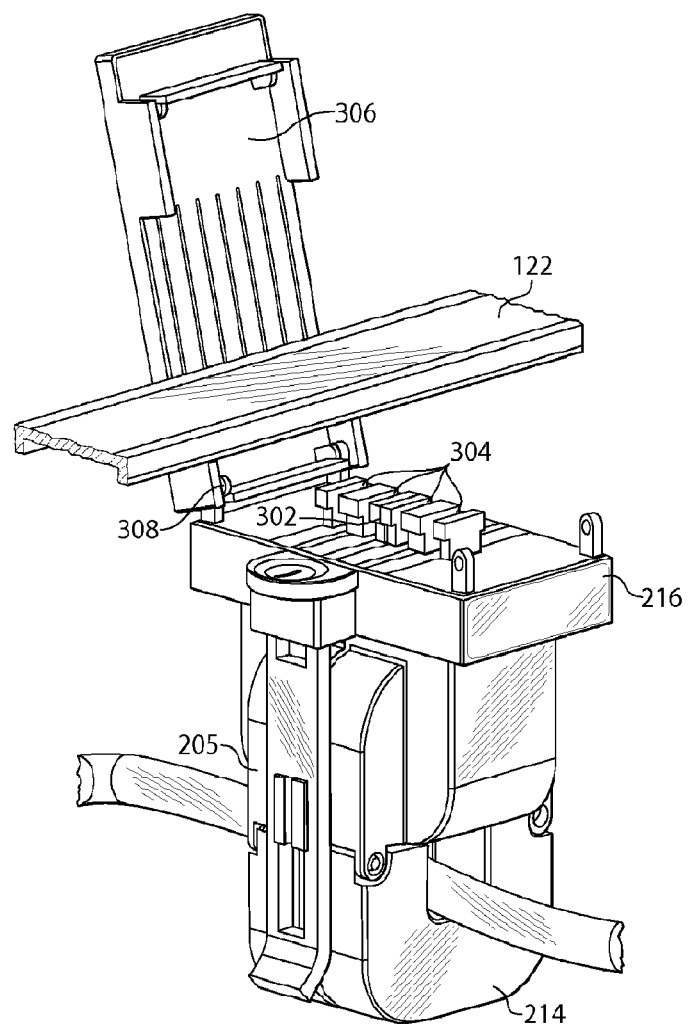
FIG. 3A is a schematic diagram of a smart CT prior to being coupled to a communication bus in accordance with aspects of the present invention.
Figure 3B:
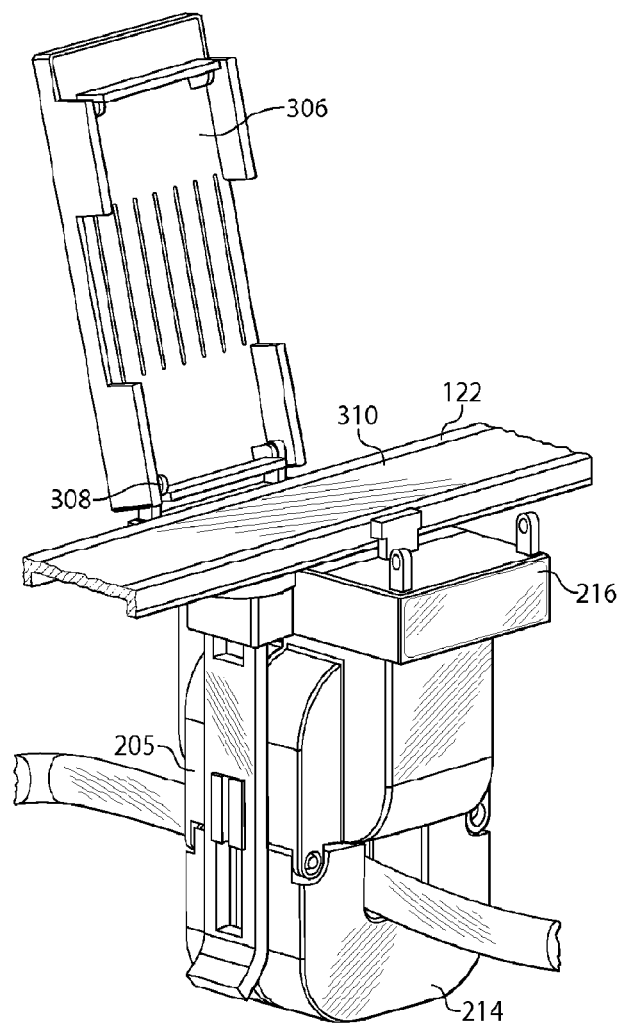
FIG. 3B is a schematic diagram of a smart CT after being coupled to a communication bus in accordance with aspects of the present invention.
Figure 3C:
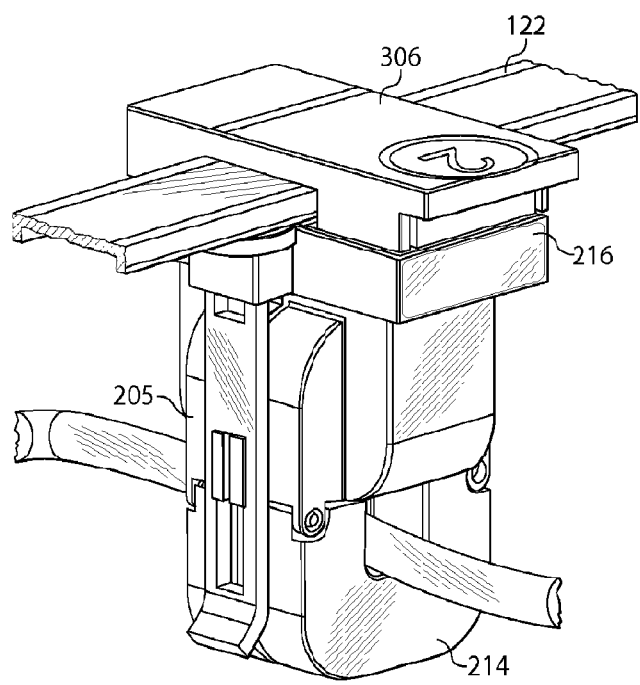
FIG. 3C is a schematic diagram of a smart CT locked together with a communication bus in accordance with aspects of the present invention.

FIGS. 3A, 3B and 3C illustrate a process of coupling the second portion 216 to a communication bus 122. FIG. 3A illustrates the second portion 216 prior to being connected to a communication bus 122. FIG. 3B illustrates the second portion 216 after being connected to a communication bus 122. FIG. 3C illustrates the second portion 216 locked together with a communication bus 122. According to one embodiment, the second portion 216 includes an Insulation Displacement Connector (IDC) 302 (e.g., an AVX series 9176 IDC). According to one embodiment, the IDC 302 may include a plurality of blades 304. For example, if, as discussed above, the second portion 216 (and hence the smart sensor circuit 120) is configured to be coupled to a four-wire ribbon cable, the IDC 302 will include four blades, each blade configured to be coupled to a corresponding conductor within the cable. However, according to other embodiments, the IDC 302 may include any number of blades to adequately connect the smart sensor circuit 120 to the communication bus 122.

The second portion 216 may also include a locking lid 306 coupled to the second portion 216 via a hinge 308. Prior to being coupled to the communication bus 122, the locking lid 306 of the second portion 216 is swung away from the IDC 302, allowing a user to place the communication bus 122 adjacent to the IDC 302. The user presses down on the communication bus 122, causing the communication bus 122 to press against the IDC 302. The plurality of blades 304 of the IDS 302 pierce the outer insulation layer 310 of the communication bus 122, each one of the plurality of blades 304 connecting with a corresponding conductor within the communication bus 122. The user may then swing the locking lid towards the IDC 302 and press down on the locking lid to lock the communication bus 122 into place. According to other embodiments, the second portion 216 (and hence the smart sensor circuits 120) may be coupled to the communication bus 122 in a different manner. For example, smart sensor circuits may also be coupled to the communication bus 122 via a bus bar. Upon being coupled to the communication bus 122, the smart sensor circuit 120 is in electrical communication with the PVS 124.

Figure 4:
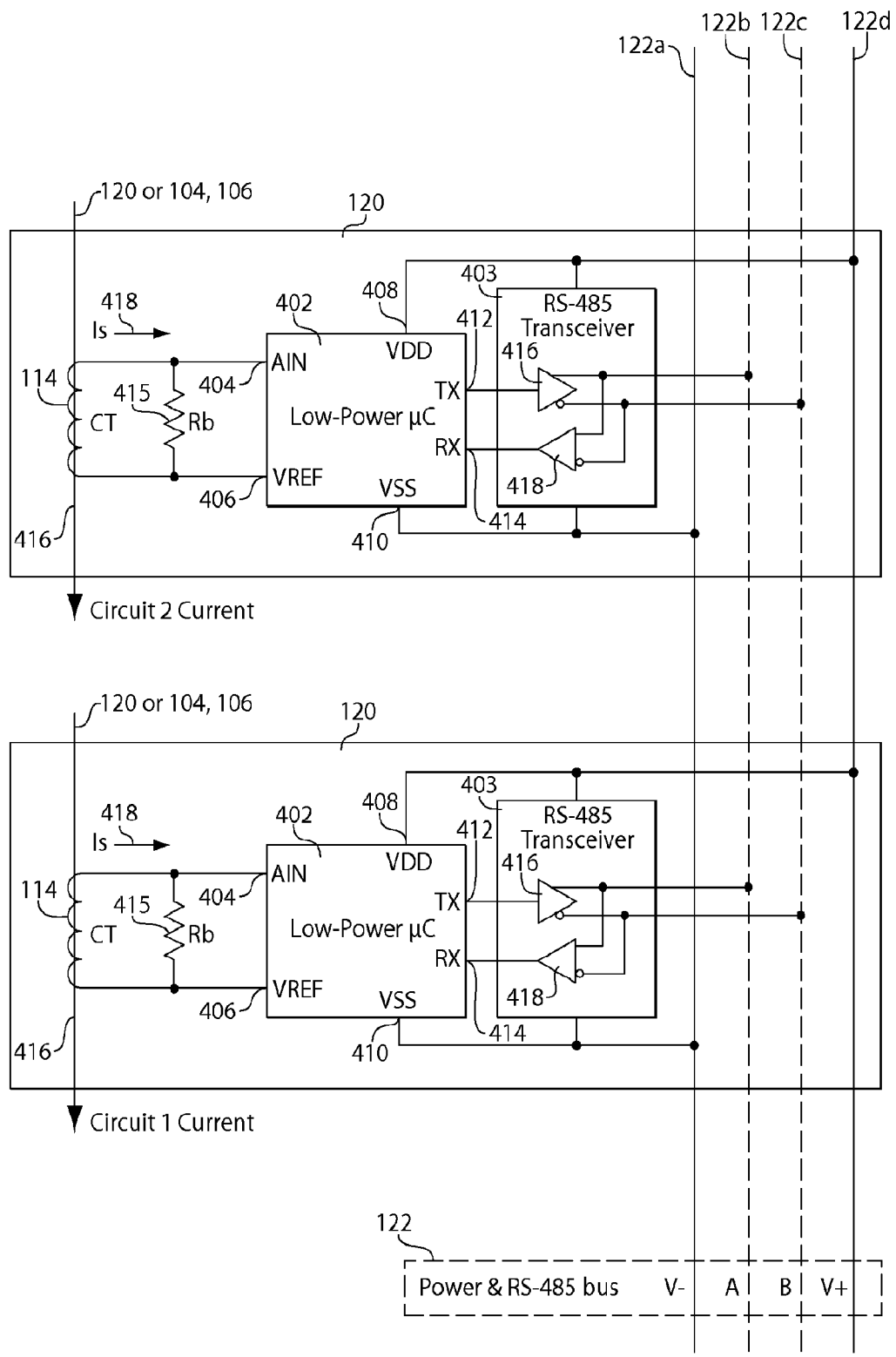
FIG. 4 is a circuit diagram of smart CT's coupled to a daisy chain bus in accordance with aspects of the present invention.

FIG. 4 is a circuit diagram of a plurality of CT's 114 and smart sensor circuits 120 coupled to a communication bus 122. Each CT 114 is coupled to a circuit branch 102, or input line 104, 106, as discussed above. For example, in one embodiment each CT 114 is configured to encompass a circuit branch 102, or input line 104, 106, as discussed in relation to FIGS. 2A and 2B. Each smart sensor circuit 120 is coupled to a communication bus 122 as discussed above. According to one embodiment, the communication bus 122 may be a 4-wire ribbon cable including a power line 122$d$, a D− differential pair line 122$c$, a D+ differential pair line 122$b$, and a return (ground) line 122$a$. In one embodiment, the communication bus 122 is a RS-485 bus; however, according to other embodiments, a different type of bus may be used.

Each smart sensor circuit 120 includes a microcontroller 402. In one embodiment, the microcontroller 402 is a low power microcontroller (e.g., a TI MSP430 family low power microcontroller). The microcontroller 402 includes an analog interface 404, a reference interface 406, a power interface 408, a return interface 410, a transmission interface 412 and a reception interface 414. According to one embodiment, the power interface 408 is coupled to the power line 122$d$ and the return interface 410 is coupled to the return line 122$a$. In this way, each smart sensor circuit 120 is powered by the communication bus 122 (i.e., by DC power provided by the PVS 124 as discussed above). According to another embodiment, each CT 114 is coupled in parallel between the analog interface 404 and the reference interface 406. In one embodiment, each smart sensor circuit 120 also includes a burden resistor 415 coupled in parallel between the analog interface 404 and the reference interface 406.

Each smart sensor circuit 120 also includes a transceiver 403 (e.g., an RS-485 Transceiver). The transceiver 403 includes a first diode 416 coupled between the transmission interface 412 and the communication bus 122, and a second diode 418 coupled between the reception interface 414 and the communication bus 122. Also, in one embodiment, the transceiver 403 is coupled in parallel between the power line 122$d$ and the return 122$a$ line.

As discussed previously, AC current 416 in the circuit branch 102 or input line 104, 106 to which a CT 114 is coupled, will produce a proportionate AC current 418 in the CT 114. The burden resistor 415 converts the proportionate AC current 418 into a proportionate AC voltage. Via the analog interface 404, the microcontroller 402 receives the proportionate AC voltage and converts the proportionate AC voltage into a digital value. The microcontroller 402 then provides the digital value to the transmission line 122$b$ via the transmission interface 412 and transceiver 403, and transmits the digital value over the communication bus 122 to the PVS 124.

In addition, according to one embodiment, the microcontroller 402 is configured to receive voltage, frequency and/or phase information from the PVS 124, via the reception line 122$c$, the transceiver 403 and the reception interface 414. As discussed above, in one embodiment, the microcontroller 402 may use the phase information received from the PVS 124 to synchronize current measurements in the smart sensor circuits 120 with voltage measurements in the PVS 124

Figure 5A:
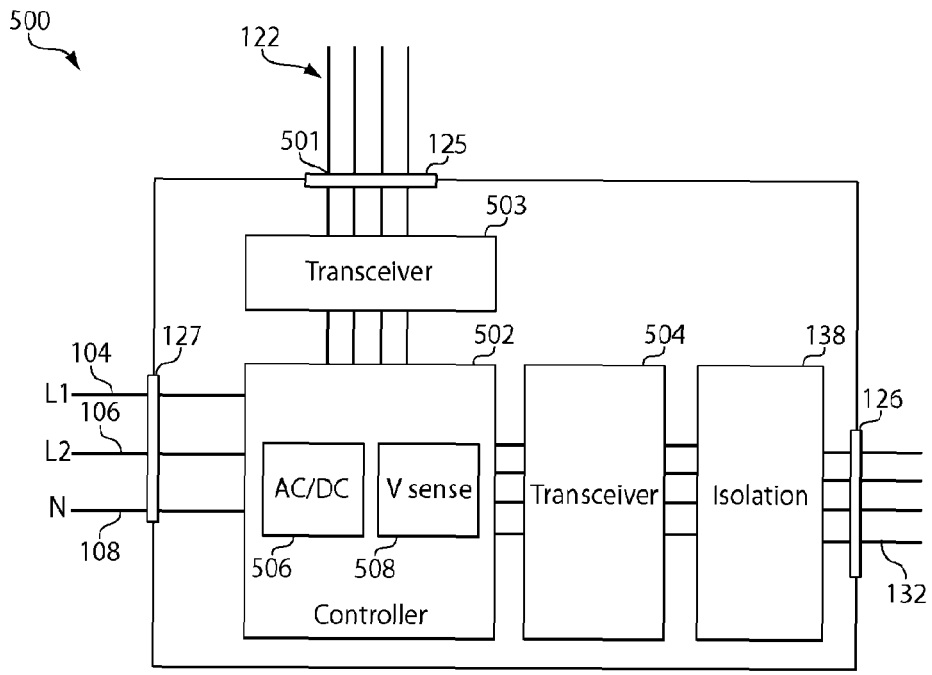
FIG. 5A is a block diagram of one embodiment of a Power Voltage Sense (PVS) module in accordance with aspects of the present invention.

FIG. 5A is a block diagram of one embodiment of a PVS 500. As discussed above, the PVS 500 includes a digital interface 125, an analog interface 127, and a digital output 126. The PVS 500 also includes a controller 502, a first transceiver 503, a second transceiver 504, and an isolation circuit 138. In one embodiment, the controller 502 includes an AC/DC converter 506 and a voltage sense circuit 508. According to one embodiment, the transceivers 502, 504 are RS-485 transceivers; however, in other embodiments, any appropriate type of transceiver may be utilized.

The communication bus 122 is coupled to the digital interface 125. According to one embodiment, the digital interface 125 is coupled to an end 501 of the communication bus 122. For example, according to one embodiment, the digital interface 125 includes a connector that is compatible with a mating connector at a terminus of the communication bus 122. However, in other embodiments, the digital interface 125 of the PVS 500 may be coupled to the communication bus 122 at any other position along the communication bus 122 and the digital interface 125 may include any type of connector to be connected to the communication bus 122.

The analog interface 127 is coupled to the input power lines 104, 106 and the neutral line 108. According to one embodiment, the analog interface 127 is coupled directly to the input power lines 104, 106 and the neutral line 108. According to another embodiment, the analog interface 127 is coupled to the input power lines 104, 106 via at least one circuit branch 102. According to one embodiment, the analog interface is a terminal block configured to receive the input lines 104, 106 and neutral line 108 (or wires coupled to the input lines 104, 106 and neutral line 108). According to another embodiment, the analog interface 127 allows the input power lines 104, 106 and neutral line 108 (or associated wires coupled to the input lines 104, 106 and neutral line 108) to be coupled directly to the controller 502. According to one embodiment the analog interface 127 includes a mechanical strain relief configured to secure the input lines 104, 106 and neutral line 108 (or associated wires coupled to the input lines 104, 106 and neutral line 108) to the PVS 500; however, in other embodiments, any type of analog interface 127 may be utilized.

The digital output 126 of the PVS 500 is coupled to a cable 132. According to one embodiment, the digital output 126 includes a mechanical strain relief configured to secure the cable 132 to the PVS 500. According to one embodiment, the cable 132 includes a plurality of wires. For example, in one embodiment, the cable 132 is a ribbon cable including 4 wires (a power line, a return line, D+ differential pair line, D− differential pair line); however, in other embodiments, the cable 132 may include any number and/or type of wires. According to one embodiment, the cable 132 is a ruggedized cable; however, in other embodiments, any type of cable 132 may be utilized.

The cable 132 is coupled between the digital output 126 of the PVS 500 (within the load center 101) to the collector 128 (external the load center 101) via a conduit 134 (as shown in FIG. 1). The conduit 134 allows the cable 132 to pass through the housing 103. According to one embodiment, the conduit 134 is a cable gland; however, in other embodiments, the conduit 134 may be any type of conduit that allows the cable 132 to pass through the housing 102 of the load center 101.

According to one embodiment, AC power is provided from an external source (e.g., a utility power system) to the input lines 104, 106. AC power from the input lines 104, 106 is provided to each of the external loads, via the circuit branches 102. The PVS 500 receives AC power from the input lines 104, 106 (or from a wire or circuit branch 102 coupled to the input lines 104, 106) via the analog interface 127. The controller 502 receives the AC power from the analog interface 127 and the AC/DC converter 506 converts the received AC power into DC power having a desired DC voltage level and provides the converted DC power to the communication bus 122 (via the transceiver 503 and the digital interface 125) and the cable 132 (via the transceiver 504, the isolation circuit 138, and the digital output 126) to power the smart sensor circuits 120 coupled to the communication bus 122 and the collector 128 respectively.

In addition to acting as a power supply for the smart sensor circuits 120 coupled to the communication bus 122 and the collector 128, the PVS 500 also measures the AC voltage, frequency and/or phase of the AC power received from the input lines 104, 106 via the analog interface 127. For example, according to one embodiment, the controller 502 receives the AC power from the analog interface 127 and the voltage sense circuit 508 measures the AC voltage, frequency and/or phase of the received AC power. According to one embodiment, the external power supply coupled to the analog interface 127 of the PVS 500 is the same power supply coupled to the input lines 104, 106 that provide power to the external loads via the circuit branches 102. Accordingly, power received by the PVS 500 is substantially the same as power being provided to the circuit branches 102 and the voltage, frequency and/or phase of the received power measured by the voltage sense circuit 508 is substantially the same as the voltage, frequency and/or phase of the power being provided to the circuit branches 102.

According to one embodiment, the controller 502 communicates signals related to the measured AC voltage, frequency and/or phase information of the received AC power to the smart sensor circuits 120, via the transceiver 503, the digital interface 125, and the communication bus 122. For example, in one embodiment, the controller 502 transmits phase information of the received AC power to the smart sensor circuits 120 so that the controller 502 of the PVS 500 may be synchronized with the smart sensor circuits 120. The synchronization of the PVS 500 with the smart sensor circuits 120 will be discussed in greater detail below.

The controller 502 of the PVS 500 also receives digital current signals from the smart sensor circuits 120 (received via the digital interface 125, transceiver 503, and communication bus 122). The controller 502 utilizes the measured AC voltage, frequency, and/or phase information and the digital current signals received from the smart sensor circuits 120 to calculate power and energy parameters such as RMS current, true and apparent power, and power factor of the circuit branch 102 or input line 104, 106. The controller 502 provides digital signals related to the calculated power and energy parameters to the collector 128 via the transceiver 504, isolation circuit 138, digital output 126, and cable 132. According to one embodiment, the controller 502 also provides digital signals related to the measured current, voltage, frequency, and/or phase information to the collector 128 via the transceiver 504, isolation circuit 138, digital output 126, and cable 132.

The digital signals related to the measured current, voltage, frequency and/or phase information and the digital signals related to power and energy parameters calculated by the controller 502 are compatible (e.g., utilize the same communication protocol). For example, according to one embodiment, the controller 502 utilizes the RS-485 physical communication protocol to communicate with the smart current sensors 120 over the communication bus 122 and with the collector 128 over the cable 132. However, in other embodiments, other physical communication protocols may be used. Communication between the controller 502, the smart sensor circuits 120, and the collector 128 is discussed in greater detail below.

The isolation circuit 138 is configured to provide isolation between the components of the system 100 internal to the load center 101 (e.g., the smart sensor circuits 120 and the input lines 104, 106) from components of the system 100 external to the load center 101 (e.g., the collector 128). According to one embodiment, the isolation circuit 138 is configured to prevent high voltage signals from passing from the PVS 124 to the cable 132. In one embodiment, the isolation circuit 138 includes a plurality of opto-couplers coupled between the digital output 126 and the transceiver 504; however, in other embodiments, any type of isolation circuit 138 may be utilized. The PVS 500 may also include another isolation circuit 138 coupled between the controller 502 and the transceiver 503 and configured to prevent high voltage signals from passing from the PVS 500 to the communication bus 122. In another embodiment, the AC/DC converter 506 may also include isolation circuitry configured to isolate the input lines 104, 106 from the communication bus 122 and cable 132.

The PVS 500 also defines the communication and addressing on the communication bus 122 and the cable 132. For example, upon being powered, the controller 502 begins to communicate with the smart sensor circuits 120 via the communication bus 122. According to one embodiment, the controller 502 may utilize the RS-485 physical communication protocol to communicate over the communication bus 122 and the cable 132. However, in other embodiments, other physical communication protocols may be used. The controller 502 identifies which smart sensor circuits 120 are coupled to the communication bus 122 and assigns each smart sensor circuit 120 a unique address. According to one embodiment, each time a new smart sensor circuit 120 is coupled to the communication bus 122, it is assigned a new address by the controller 502.

According to one embodiment, the controller 502 utilizes the Modbus serial communication protocol to define the communication and addressing on the communication bus 122 and the cable 132. The controller 502, using the Modbus protocol, assigns unique addresses to the smart sensor circuits 120 and sets the structure and format of the data that is transmitted over the communication bus 122 and the cable 132. For example, communication over the communication bus 122 and the cable 132 using the Modbus protocol may be performed as described in U.S. patent application Ser. No. 13/089,686 entitled "SYSTEM AND METHOD FOR TRANSFERRING DATA IN A MULTI-DROP NETWORK", filed on Apr. 19, 2011, which is herein incorporated by reference in its entirety. In one embodiment, the controller 502 utilizes an auto addressing scheme. For example, in one embodiment, the controller 502 utilizes an auto addressing scheme as described in U.S. patent application Ser. No. 13/089,678 entitled "SYSTEM AND METHOD FOR AUTOMATICALLY ADDRESSING DEVICES IN A MULTI-DROP NETWORK", filed on Apr. 19, 2011, which is herein incorporated by reference in its entirety.

According to one embodiment, the Modbus protocol allows for up to 255 smart sensor circuits 120 to be simultaneously attached to the communication bus 122. The number of sensors may be limited by the load center 101 itself. For example, in common residential load centers, the maximum number of branch circuits (and hence smart sensor circuits) is seventy-two. However, according to at least one embodiment, different communication protocols may be used by the controller 502 to allow for any number of sensors to be coupled to the communication bus 122 (e.g., for use in large, commercial load centers).

According to one embodiment, once all of the smart sensor circuits 120 have been identified and assigned addresses by the controller 502, a user, via a user interface of the PVS 500, may associate each smart sensor circuit 120 with a specific load.

Once the identification and addressing of the smart sensor circuits 120 is complete, the controller 502 monitors the signals received over the communication bus 122 (e.g., digital current signals from the smart sensor circuits 120) and measures the AC voltage, frequency and/or phase of the AC power received from the input lines 104, 106. As discussed above, the controller 502 utilizes the received current information and the measured voltage, frequency and/or phase information to calculate power and energy parameters such as RMS current, true and apparent power, and power factor of the circuit branch 102 or input line 104, 106. Signals related to the calculated power and energy parameters, received current information, and/or measured AC voltage, frequency and/or phase information may be transmitted to the collector 128 via the transceiver 504, isolation circuit 138, digital output 126 and cable 132.

By utilizing a separate PVS module 124 that is integrated with other smart sensor circuits 120 in the system 100 to generate DC source power and measure input AC voltage, phase and/or frequency information, current information from the smart sensor circuits 120, input voltage, frequency and/or phase information measured by the PVS 500, power and energy parameters calculated by the PVS 500, and the DC source power from the PVS 500 may all be provided to the collector 128 (external the load center 101) via the same single cable 134. In addition, by locating the collector 128 external the load center 101 and preventing high voltage from passing from the PVS 500 to the cable 132, potential interference due to wireless communications by the collector 128 may be reduced, product safety of the system 100 may be improved, and regulatory restrictions on the system 100 may be reduced.

According to one embodiment, as described above, the PVS 500 also synchronizes current measurements performed by each smart sensor circuit 120 with voltage measurements performed by the PVS 500. In this way, current and voltage information received by the PVS 500 may be synchronized and power and/or energy power parameters calculated by the PVS 500 may be based on synchronized current and voltage measurements.

Figure 6A:
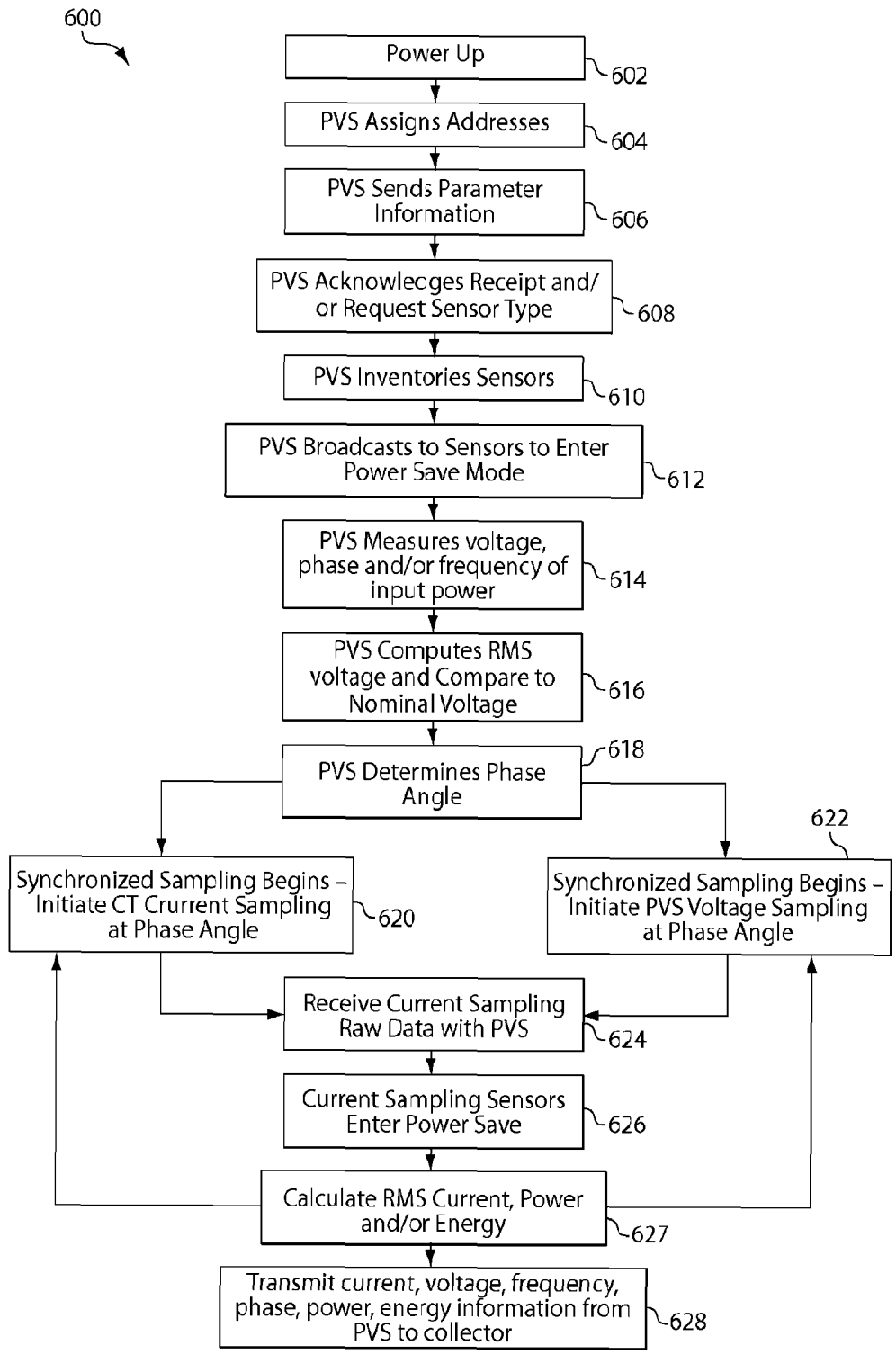
FIG. 6A is a flow chart of a method of operation of a system in accordance with aspects of the present invention.

A flow chart illustrating one embodiment of a process 600 for operating the system 100 to synchronize current and voltage measurements with the PVS 500 is shown in FIG. 6A. At block 602, the PVS 500, and hence the smart sensor circuits 120 and collector 128, are powered up. At block 604, the PVS 500 assigns unique addresses to each smart sensor circuit 120 (as discussed above), via the communication bus 122. In one embodiment, the PVS 500 utilizes an auto addressing scheme, as discussed above. At block 606, the PVS 500 broadcasts parameter information to each smart sensor circuit 120 via the communication bus 122. In one embodiment, the parameter information includes at least one of a predefined frequency (or period), the number of samples per period, and a defined sleep timer. In another embodiment, the broadcast information includes scaling parameters. According to another embodiment, the broadcast information includes previous cycle computation results (e.g., for RMS current, power, energy).

At block 608, the PVS 500 requests each smart sensor circuit 120 to acknowledge the receipt of the broadcast information via the communication bus 122. In one embodiment, at block 608, the PVS 500 also requests that each smart sensor circuit 120 transmit its sensor type (e.g., 20A, 80A, or 200A current transformer) to the PVS 500 via the communication bus 122. At block 610, the PVS 500 creates an inventory of all of the smart sensor circuits 120 and their type (e.g., by model number).

At block 612, the PVS 500 transmits to each smart sensor circuit 120 (via the communication bus 122) that the smart sensor circuit 120 should enter power save mode. Once a smart sensor 120 enters power save mode, a sleep timer is enabled. The use of the sleep timer is intended to limit the overall power consumption of the system. For example, when a smart sensor 120 is in power save mode, the smart sensor 120 will not communicate on the communication bus 122, and hence will require a lower level of power (e.g., from the PVS 500), until the sleep timer has expired. By placing at least a portion of the smart sensors 120 in power save mode, the total number of smart sensors 120 requiring full power is limited and the total power consumption of the system may be reduced. The sleep timer may be programmable. In one embodiment, the sleep timer is configured with a time equal to slightly less than the total number of smart sensors 120 multiplied by the period over which current is to be sampled.

For example, in one embodiment, the sleep timer is configured with a time (T) calculated with the following formula:

$$T=(s-2)*t+(t/2);$$

where:

s represents the total number of smart sensors 120, and t represents the sample period defined by the PVS 500.

In one example, where the sample period is 20 ms and the system includes a total of 6 smart sensors 120, the time T is calculated as 90 ms. In this example, after a smart sensor 120 has conducted measurements and finished transmitting current sample raw data, it will enter power save mode for 90 ms and will not sample current again until time T (90 ms) has expired. However, in other embodiments, the sleep timer may be configured differently.

The smart sensors 120 currently in power save mode may be configured to exit power save mode early (i.e., before the expiration of time T), to prepare for current sampling which will begin upon the expiration of time T. For example, in one embodiment, smart sensors 120 currently in power save mode are configured to exit power save mode 10 ms early. In such an embodiment, the total time each smart sensor 120 will be awake is 30 ms (20 ms period in addition to 10 ms awakening period). By staggering the current sampling performed by the smart sensors 120, the number of smart sensors 120 requiring power at the same time is limited and as a result, the total power consumption of the system is reduced. This may be particularly useful for battery operated systems.

At block 614, the PVS 500 senses the voltage, frequency and/or phase of the AC power signal information received from the input lines 104, 106 via the analog interface 127. For example, according to one embodiment discussed above, the controller 502 of the PVS 500 includes a voltage sense circuit 508 that senses voltage, frequency and/or phase of the received input AC power.

At block 616, the PVS 500 computes the RMS voltage for all phases that are present (e.g., 1, 2, or 3) in the received AC input power of the load center 101. Also at block 616, the PVS 500 compares the RMS voltage to a nominal voltage (e.g., received from the collector 128 or programmed into the PVS 500) to confirm that the calculated RMS voltage is correct. For example, if the system 100 is connected to a utility system in North America, the collector 128 will provide a nominal voltage to the PVS 500 that, upon comparison by the PVS 500, confirms that the PVS 500 should be measuring 120V, 60 Hz input signals. However, if the system 100 is connected to a utility system in Europe, the collector 128 will confirm (by sending a corresponding nominal voltage to the PVS 500) that the PVS 500 is measuring 220V, 50 Hz input signals.

At block 618, based on the calculated RMS voltages of the received input AC power, the PVS 500 determines the appropriate phase angle at which synchronized measurements (i.e., of voltage and current) will be taken. According to one embodiment, the phase angle may be configured as any phase angle, and does not have to be limited to a zero crossing. In some embodiments, the phase angle may be configured at an angle other than at a zero crossing to intentionally avoid noise which may exist at the zero crossing.

At blocks 620 and 622, synchronized sampling by the PVS 500 and the smart sensor circuits 120 begins at the previously determined phase angle. For example, at block 620, the PVS 500 communicates to each smart sensor circuits 120 simultaneously, via the communication bus 122, to start sampling current in their respective circuit branches 102 at the predetermined phase angle. Also, at relatively the same time as block 620, the PVS 500 at block 622 initiates voltage sampling of the input power signal information received from the input lines 104, 106 at the previously determined phase angle to synchronize the voltage measurements with the current measurements made by the smart sensor circuits 120. According to one embodiment, the PVS 500 samples voltage over the same period of time in which the smart sensor circuits 120 sample current.

According to another embodiment, instead of communicating to all of the smart sensor circuits 120 simultaneously, the PVS 500 communicates, via the communication bus 122, to at least one specific sensor (e.g., a sensor having a unique address) to begin sampling current in the respective circuit branch 102. In this way, the PVS 500 is able to start sampling current in at least one specific type of circuit branch (e.g., a circuit branch coupled to a specific type of load). By only sampling current in a select number of circuit branches 102, the overall power consumption of the system may be reduced.

According to one embodiment, each smart sensor circuit 120 which is controlled to begin sampling will sample current in the smart sensor circuits 120 respective branch over a predefined period of time for a predefined number of samples, the time and number of samples being previously set by the PVS 500 in the broadcast parameter information. In one embodiment, the current sampling raw data is stored in a buffer of each smart sensor circuit 120.

At block 624, upon completing voltage sampling for the given period, the PVS 500 requests that each smart sensor circuit that was sampling current, transmit the current sampling raw data for the given time period from the buffer to the PVS 500 via the communication bus 122. According to one embodiment, the current sampling raw data is time-stamped.

At block 626, upon confirming receipt of the current sampling raw data, the PVS 500 broadcasts to the previous current sampling smart sensors 120 that the smart sensors 120 should enter power save mode, making more power available for other smart sensors (as discussed above).

At block 627, the PVS 500 utilizes the received current data (from the smart sensor circuits 120) and measured voltage, frequency and/or phase information to calculate the RMS current, power (e.g., 4 quadrant) and/or energy usage of the circuit branches 102 associated with the smart sensors 102 from which the PVS 500 received the raw current sampling data. According to one embodiment, the PVS 500 may automatically take into account any communication delay between the PVS 500 and the smart sensors 102 when making its current, power and/or energy calculations.

At block 628, the PVS transmits signals related to calculated power and energy parameters, received current information, and/or measured AC voltage, frequency, and/or phase information to the collector via the single cable 132. Upon transmitting the current, voltage, frequency, phase, energy and/or power information to the collector 128, the PVS 500 may repeat blocks 620 to 628 for the same smart sensor(s), another smart sensor 120, or another group of smart sensors 120.

In at least some embodiments, the use of the PVS 500 to individually control the synchronization of the smart sensor circuits 120 via the communication bus 122, eliminates a need to individually wire each smart sensor circuit 120 with phase synchronization signals from the PVS 500. Phase Locked Loop (PLL) circuitry within the smart sensor circuits 120 may also be eliminated, as the PVS 500 will control the synchronization. By allowing the PVS 500 to select the phase angle at which sampling will occur, the flexibility of the system may be increased. For example, any appropriate phase angle may be selected to provide the most desirable results.

Figure 5B:
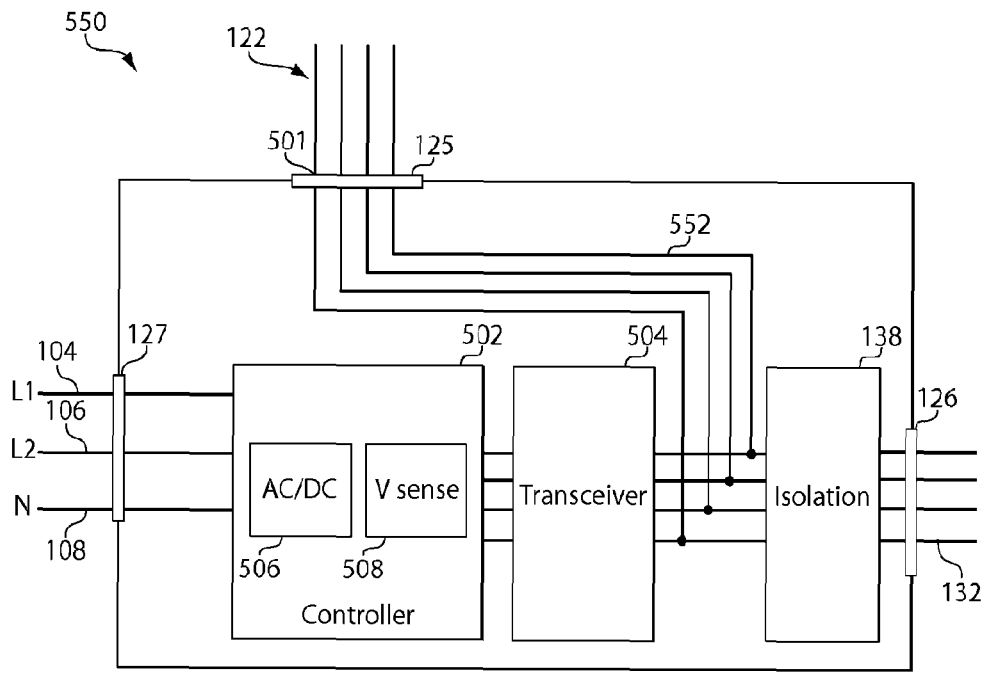
FIG. 5B is a block diagram of another embodiment of a PVS module in accordance with aspects of the present invention.

FIG. 5B is a block diagram of another embodiment of a PVS 550. The PVS 550 is substantially the same as the PVS 500 described above with regard to FIG. 5A, except that in the PVS 550, the transceiver 503 is removed and the digital interface 125 is coupled to the isolation circuit 138 and the transceiver 504 via a PVS bus 552.

AC power is provided from an external source (e.g., a utility power system) to the input lines 104, 106. The PVS 550 receives the AC power and converts the AC power into DC power having a desired DC voltage level (e.g., a low DC voltage level). The converted DC power is provided to the communication bus 122 (via the transceiver 504, the PVS bus 552, and the digital interface 125) and the cable 132 (via the transceiver 504, the isolation circuit 138, and the digital output 126) to power the smart sensor circuits 120 coupled to the communication bus 122 and the collector 128 respectively.

In addition to acting as a power supply for the smart sensor circuits 120 coupled to the communication bus 122 and the collector 128, the PVS 550 also measures the AC voltage, frequency and/or phase of the AC power received from the input lines 104, 106 via the analog interface 127. The controller 502 of the PVS 550 transmits signals related to the measured AC voltage, frequency, and/or phase information to the collector 128 via the transceiver 504, the isolation circuit 138, the digital output 126, and the cable 132.

The PVS 550 also receives digital current signals from the smart sensor circuits 120 (received via the digital interface 125) and passes the digital current signals to the collector 128 via the PVS bus 552, the isolation circuit 138, the digital output 126 and the cable 132.

The digital signals from the smart sensor circuits 120 related to the measured current and the digital signals from the PVS 500 related to measured voltage, frequency and/or phase information are compatible (e.g., utilize the same communication protocol). For example, according to one embodiment, the controller 502, the smart sensor circuits 120, and the collector 128 each utilize the RS-485 physical communication protocol to communicate over the communication bus 122, the PVS bus 552, and the cable 132. However, in other embodiments, other physical communication protocols may be used. Communication between the controller 502, the smart sensor circuits 120, and the collector 128 is discussed in greater detail below.

The isolation circuit 138 is configured to provide isolation between the components of the system 100 internal to the load center 101 (e.g., the smart sensor circuits 120 and the input lines 104, 106) from components of the system 100 external to the load center 101 (e.g., the collector 128). According to one embodiment, the isolation circuit 138 is configured to prevent high voltage signals from passing from the PVS 124 to the cable 132.

As discussed above, the collector 128 (shown in FIG. 1) receives signals, via the single cable 132, related to current information from the smart sensor circuits 120 (via the PVS 550) and voltage, frequency and/or phase information measured by the PVS 550. According to one embodiment, the collector 128 defines the communication and addressing on the communication bus 122 and the cable 132.

For example, upon being powered (e.g., by the PVS 550 as discussed above), the collector 128 begins to communicate with the smart sensor circuits 120 and the PVS 550 via the cable 132 and the communication bus 122. According to one embodiment, the collector 128 may utilize the RS-485 physical communication protocol to communicate over the communication bus 122 and the cable 132. However, in other embodiments, other physical communication protocols may be used. The collector 128 identifies which sensors (i.e., smart sensor circuits 120 and the PVS 550) are coupled to the communication bus 122 and the cable 132 and assigns each sensor (i.e., each smart sensor circuit 120 and the PVS 550) a unique address. According to one embodiment, each time a new smart sensor circuit 120 is coupled to the communication bus 122, it is assigned a new address by the collector 128.

According to one embodiment, the collector 128 utilizes the Modbus serial communication protocol to define the communication and addressing on the communication bus 122 and the cable 132. The collector 128, using the Modbus protocol, assigns unique addresses to the smart sensor circuits 120 and the PVS 550 and sets the structure and format of the data that is transmitted over the communication bus 122 and the cable 132. For example, communication over the communication bus 122 and the cable 132 using the Modbus protocol may be performed as described in U.S. patent application Ser. No. 13/089,686 entitled "SYSTEM AND METHOD FOR TRANSFERRING DATA IN A MULTI-DROP NETWORK", filed on Apr. 19, 2011, which is herein incorporated by reference in its entirety. In one embodiment, the collector 128 utilizes an auto addressing scheme. For example, the collector 128 utilizes an auto addressing scheme as described in U.S. patent application Ser. No. 13/089,678 entitled "SYSTEM AND METHOD FOR AUTOMATICALLY ADDRESSING DEVICES IN A MULTI-DROP NETWORK", filed on Apr. 19, 2011, which is herein incorporated by reference in its entirety.

According to one embodiment, the Modbus protocol allows for up to 255 sensors (including the smart sensor circuits 120 and the PVS 550) to be simultaneously attached to the communication bus 122 and the cable 132. The number of sensors may be limited by the load center 101 itself. For example, in common residential load centers, the maximum number of branch circuits (and hence smart sensor circuits) is seventy-two. However, according to at least one embodiment, different communication protocols may be used by the collector 128 to allow for any number of sensors to be coupled to the communication bus 122 and the cable 132 (e.g., for use in large, commercial load centers).

According to one embodiment, once all of the sensors (i.e., the smart sensor circuits 120 and the PVS 550) have been identified and assigned addresses by the collector 128, a user, via a user interface of the collector 128, may associate each smart sensor circuit 120 with a specific load.

Once the identification and addressing of the smart sensor circuits 120 and the PVS 550 is complete, the collector 128 monitors the signals received over the cable 132 (e.g., digital current signals from the smart sensor circuits 120 passed along by the PVS 550 or voltage, frequency and/or phase related signals from the PVS 550 itself). As discussed above, the collector 128 utilizes the current, voltage, frequency and/or phase information received from the PVS 550 (via the cable 132) to calculate power and energy parameters such as RMS current, true and apparent power, and power factor of the circuit branch 102 or input line 104, 106. This information may also be transmitted by the collector 128 to an external client (e.g., via a wireless (e.g., the RF interface 136) or hardwired (e.g., the gateway 130) connection) to assist in power management and control of a residence or other facility containing the system 100.

By utilizing a separate PVS module 124 that is integrated with other smart sensor circuits 120 in a sensor network to generate DC source power and measure input AC voltage, phase and/or frequency information, current information from the smart sensor circuits 120, input voltage, frequency and/or phase information measured by the PVS 550, and the DC source power from the PVS 550 may all be provided to the collector 128 (external the load center 101) via the same single cable 134. In addition, by locating the collector 128 external the load center 101 and preventing high voltage from passing from the PVS 550 to the cable 132, potential interference due to wireless communications by the collector 128 may be reduced, product safety of the system 100 may be improved, and regulatory restrictions on the system 100 may be reduced.

According to one embodiment, the collector 128 synchronizes current measurements performed by each smart sensor circuit 120 with voltage measurements performed by the PVS 550. In this way, current and voltage information received by the collector 128 (e.g., via the cable 132) may be synchronized and power and/or energy power parameters calculated by the collector 128 may be based on synchronized current and voltage measurements.

Figure 6B:
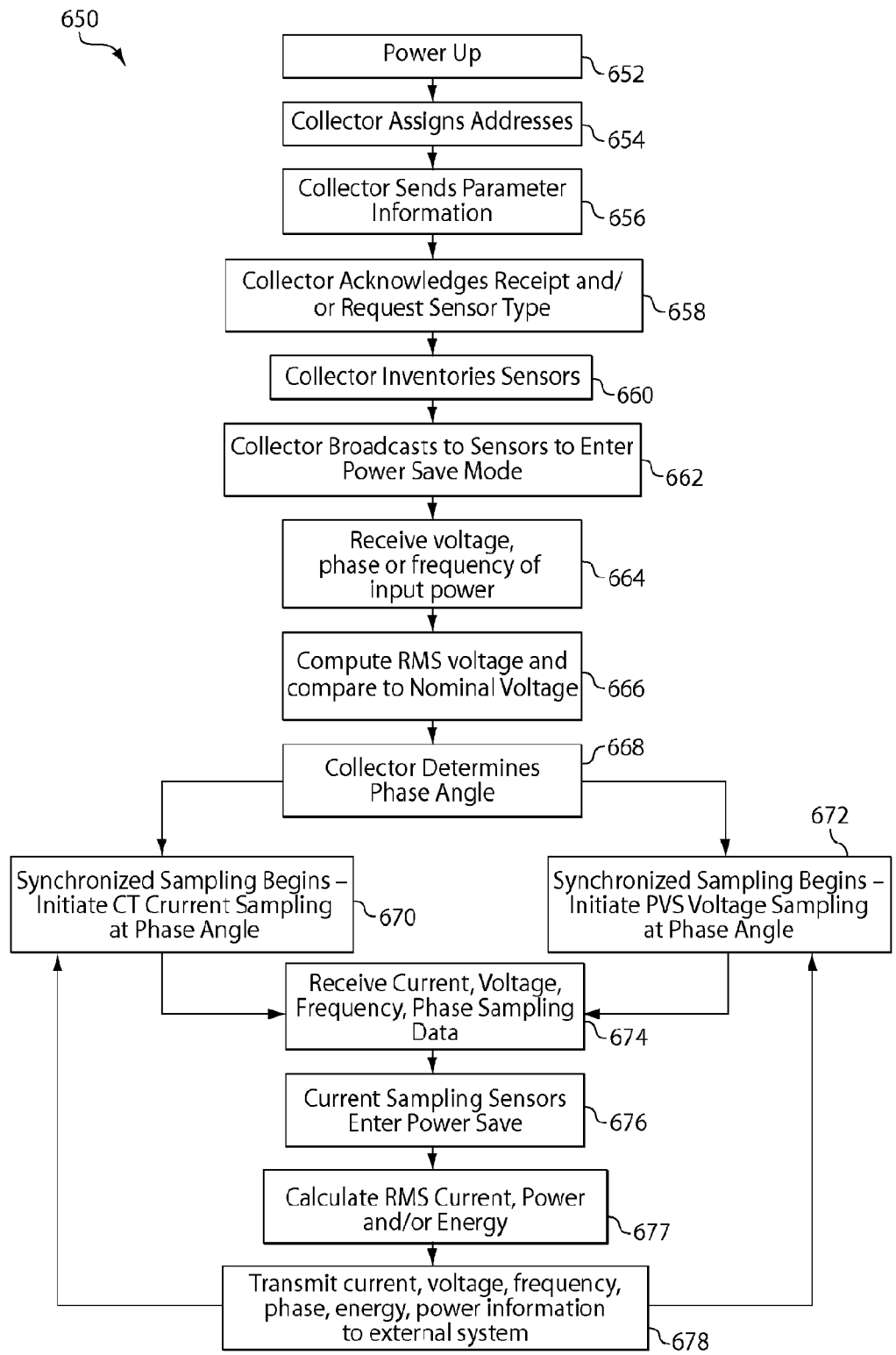
FIG. 6B is another flow chart of a method of operation of a system in accordance with aspects of the present invention.

A flow chart illustrating one embodiment of a process 650 for operating the system 100 to synchronize current and voltage measurements with the PVS 550 is shown in FIG. 6B. At block 652, the PVS 550, and hence the smart sensor circuits 120 and collector 128, are powered up. At block 654, the collector 128 assigns unique addresses to each smart sensor circuit 120 and the PVS 550 (as discussed above), via the communication bus 122, the PVS bus 552, and the cable 132. In one embodiment, the collector 128 utilizes an auto addressing scheme, as discussed above. At block 656, the collector 128 broadcasts parameter information to each smart sensor circuit 120 and the PVS 550, via the communication bus 122, the PVS bus 552, and the cable 132. In one embodiment, the parameter information includes at least one of a predefined frequency (or period), the number of samples per period, and a defined sleep timer. In another embodiment, the broadcast information includes scaling parameters. According to another embodiment, the broadcast information includes previous cycle computation results (e.g., for RMS current, power, energy).

At block 658, the collector 128 requests each smart sensor circuit 120 and the PVS 550 to acknowledge the receipt of the broadcast information via the communication bus 122, the PVS bus 552, and the cable 132. In one embodiment, at block 608, the collector 128 also requests that each sensor (i.e., each smart sensor circuit 120 and the PVS 550) transmit its sensor type (e.g., 20A, 80A, or 200A current transformer, or a voltage sensor) to the collector 128 via the communication bus 122, the PVS bus 552, and the cable 132. At block 610, the collector 128 creates an inventory of all of the sensors (i.e., the smart sensor circuits 120 and the PVS 550) and their type (e.g., by model number).

At block 662, the collector 128 transmits to each smart sensor circuit 120 (via the cable 132, the PVS bus 552, and the communication bus 122) that the smart sensor circuit 120 should enter power save mode. Once a smart sensor 120 enters power save mode, a sleep timer is enabled, as described above. The sleep timer may be programmable. In one embodiment, the sleep timer is configured with a time equal to slightly less than the total number of smart sensors 120 multiplied by the period over which current is to be sampled.

For example, in one embodiment, the sleep timer is configured with a time (T) calculated with the following formula:

$$T=(s-2)*t+(t/2);$$

where:
  s represents the total number of smart sensors 120, and
  t represents the sample period defined by the collector 128. However, in other embodiments, the sleep timer may be configured differently. In one embodiment, the smart sensors 120 currently in power save mode are configured to exit power save mode early (i.e., before the expiration of time T), to prepare for current sampling which will begin upon the expiration of time T.

At block 664, the collector 128 receives AC input voltage, frequency and/or phase information from the PVS 550 via the transceiver 504, the isolation circuit 138, the digital output 126 and the cable 132. At block 666, based on the information from the PVS 550, the collector 128 computes the RMS voltage for all phases that are present (e.g., 1, 2, or 3) in the received AC input power of the load center 101. Also at block 666, the collector 128 compares the RMS voltage to a nominal voltage to confirm that the calculated RMS voltage is correct. For example, if the system 100 is connected to a utility system in North America, the collector 128 compares the computed RMS voltage to a nominal voltage that confirms that the PVS 550 should be measuring 120V, 60 Hz input signals. However, if the system 100 is connected to a utility system in Europe, the collector 128 will confirm (by comparing the calculated RMS voltage to a corresponding nominal voltage) that the PVS 550 is measuring 220V, 50 Hz input signals.

At block 668, based on the calculated RMS voltages of the received input AC power, the collector 128 determines the appropriate phase angle at which synchronized measurements (i.e., of voltage and current) will be taken. According to one embodiment, the phase angle may be configured as any phase angle, and does not have to be limited to a zero crossing. In some embodiments, the phase angle may be configured at an angle other than at a zero crossing to intentionally avoid noise which may exist at the zero crossing.

At blocks 670 and 672, synchronized sampling by the PVS 550 and the smart sensor circuits 120 begins at the previously determined phase angle. For example, at block 620, the collector 128 communicates to all of the smart sensor circuits 120 simultaneously, via the cable 132, the PVS bus 552, and the communication bus 122, to start sampling current in their respective circuit branches 102 at the predetermined phase angle. Also, at relatively the same time as block 620, the collector 128 at block 672 communicates to the PVS 550, via the cable 132, to start sampling the input power signal information received from the input lines 104, 106 at the predetermined phase angle to synchronize the voltage measurements with the current measurements made by the smart sensor circuits 120. According to one embodiment, the PVS 550 samples voltage over the same period of time in which the smart sensor circuits 120 sample current.

According to another embodiment, instead of communicating to all of the smart sensor circuits 120 simultaneously, the collector 128 communicates, via the cable 132, the PVS bus 552, and the communication bus 122, to at least one specific sensor (e.g., a sensor having a unique address) to begin sampling current in the respective circuit branch 102. In this way, the collector 128 is able to start sampling current in at least one specific type of circuit branch (e.g., a circuit branch coupled to a specific type of load). By only sampling current in a select number of circuit branches 102, the overall power consumption of the system may be reduced.

According to one embodiment, each smart sensor circuit 120 which is controlled to begin sampling will sample current in the smart sensor circuits 120 respective branch over a predefined period of time for a predefined number of samples, the time and number of samples being previously set by the collector 128 in the broadcast parameter information. In one embodiment, the current sampling raw data is stored in a buffer of each smart sensor circuit 120.

At block 674, the collector 128 receives current measurement data from the smart sensor circuits 120 (via the communication bus, the PVS bus 552, and the cable 132) and voltage, frequency, and/or phase information from the PVS 550 (via the cable 132). According to one embodiment, the current and voltage sampling raw data is time-stamped.

At block 676, upon confirming receipt of the current, voltage, frequency, and/or phase sampling data, the collector 128 broadcasts to the previous current sampling smart sensors 120 that the smart sensors 120 should enter power save mode, making more power available for other smart sensors (as discussed above).

At block 677, the collector 128 calculates the RMS current, power (e.g., 4 quadrant) and/or energy usage of the circuit branches 102 associated with the smart sensors 102 from which the collector 128 received the raw current sampling data. According to one embodiment, the collector 128 may automatically take into account any communication delay between the collector 128, the PVS 550 and the smart sensors 102 when making its current, power and/or energy calculations.

At block 678, current, voltage, frequency, phase, energy, and/or power information may be transmitted (e.g., wirelessly or via a hardwired connection) by the collector 128 to an external system. Upon transmitting the current, voltage, frequency, phase, energy, and/or power information to the external system, the collector 128 may repeat blocks 670 to 678 for the same smart sensor(s), another smart sensor 120, or another group of smart sensors 120.

In at least some embodiments, the use of the collector 128 to individually control the synchronization of the smart sensor circuits 120 and the PVS 550, eliminates a need to individually wire each smart sensor circuit 120 with phase synchronization signals from the collector 128. Phase Locked Loop (PLL) circuitry within the smart sensor circuits 120 may also be eliminated, as the collector 128 will control the synchronization. By allowing the collector 128 to select the phase angle at which sampling will occur, the flexibility of the system may be increased. For example, any appropriate phase angle may be selected to provide the most desirable results.

Even though examples in accordance with the present invention are described herein in reference to a load center, other examples may be utilized within any electrical system in which current, power and/or energy of a power line are desired to be monitored. It also is to be appreciated that examples in accordance with the present invention may be utilized to monitor any type (e.g., commercial or residential) or size system.

Even though examples in accordance with the present invention are described herein as utilizing a current transformer 114 capable of being clamped onto a circuit branch 102, other examples may utilize a different type of current sensor. For example, current sensors utilizing shunt resistance, hall-effect, and toroidal (solid core) current transformers may be used.

In at least some examples in accordance with the present invention described herein communication between the sensor circuits 120 and the PVS 500 is conducted over a wired interface (i.e., the communication bus 122). Other examples may utilize a wireless interface. For example, communication between the sensor circuits 120 and the PVS 500 may be performed in compliance with a wireless standard such as the ZigBee RF4CE standard or the IEEE 802.15 standard as described in U.S. patent application Ser. No. 12/789,922 entitled "SYSTEM FOR SELF-POWERED, WIRELESS MONITORING OF ELECTRICAL CURRENT, POWER AND ENERGY", filed on May 28, 2010, which is herein incorporated by reference in its entirety.

The input AC power received by the system 100 from an external power source may be single, double, or three-phase AC power. Also, even though examples of the system in accordance with the present invention are described herein as including two input lines 104, 106, the system 100 may include any number of input lines necessary to receive the (single or multi-phase) AC power from the external power source. Additionally, even though examples of the PVS 500 in accordance with the present invention are described herein as being coupled to two input lines 104, 106 and monitoring input AC power on the two input lines 104, 106, the PVS 500 may be coupled, via the analog interface 127, to any number of input power lines (or corresponding wires) and may monitor input AC power provided by the any number of input power lines (or corresponding wires).

Figure 7:
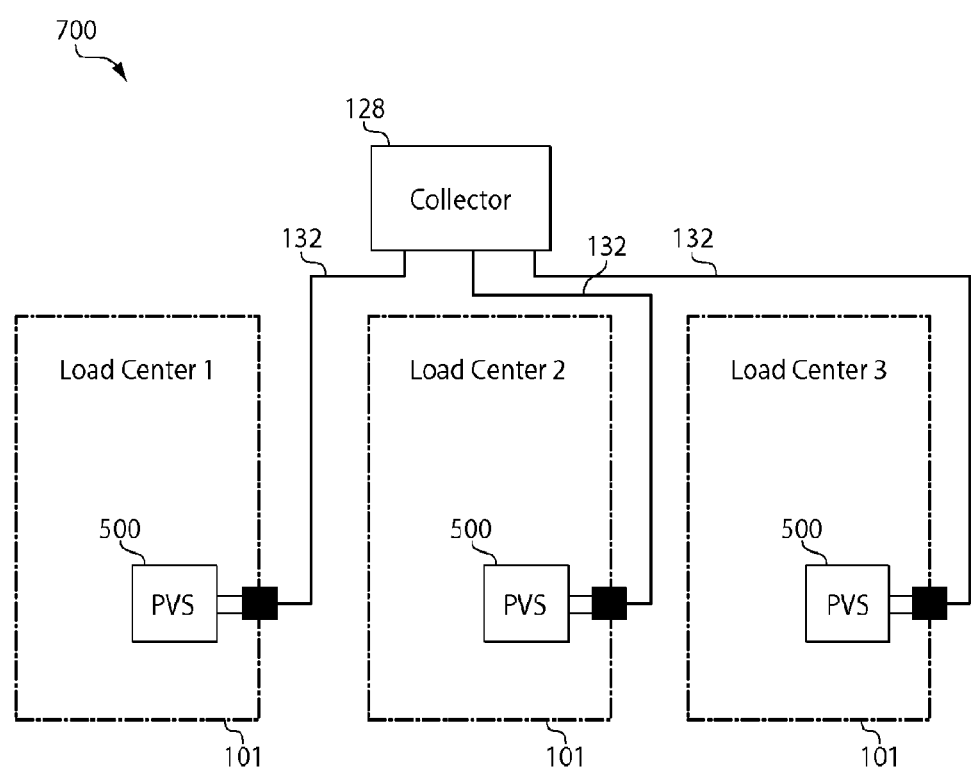
FIG. 7 is a block diagram of a multiple load center monitoring system in accordance with aspects of the present invention.

As described above, the collector 128 is coupled to a single load center 101; however, in other embodiments, the collector 128 may be coupled to multiple load centers (such as the load center 101), configured to be coupled to multiple cables (such as the cable 132), and configured to receive information from the multiple load centers. For example, FIG. 7 is a block diagram of a multiple load center 101 monitoring system 700. The system 700 includes the collector 128 and multiple load centers 101. Each load center includes a PVS (e.g., a PVS 500 as described above with regard to FIG. 5A) that is configured to monitor an associated load center 101 and provide received, measured, and/or calculated parameter information of the load center 101 to the collector 128 via a single cable 132. The collector 128 receives the information from each PVS 500 and may further distribute the information or perform additional analysis on the received information.

By including a single communication bus 122 to which all smart sensor circuits 120 are coupled, a relatively small, less complex and more manageable method and system for utilizing a plurality of CT's 114 to monitor circuit branches 102 of a load center 101 is provided. Also, by utilizing a separate PVS module 124 that is integrated with the other smart sensor circuits 120 in a sensor network to generate DC source power and measure input voltage, phase and/or frequency information, the current information from the smart sensor circuits 120, the input voltage, frequency and/or phase information, and the DC source power from the PVS 550 may all be provided to the collector 128 (external the load center 101) via the same single cable 134. In addition, by locating the collector 128 external the load center 101 and preventing high voltage from passing from the PVS 550 to the cable 132, potential interference due to wireless communications by the collector 128 may be reduced, product safety of the system 100 may be improved, modularity of the system 100 may be improved, and regulatory restrictions on the system 100 may be reduced.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:
1. A system for monitoring a plurality of circuit branches coupled to an input line within a load center having a housing, the system comprising:
   a plurality of current sensors, each current sensor of the plurality of current sensors being configured to be coupled to at least one of the plurality of circuit branches and to produce a signal having a level related to a current level of the at least one of the plurality of circuit branches;
   a communication bus;
   a plurality of sensor circuits, each coupled to an associated one of the plurality of current sensors and configured to be coupled to the communication bus, wherein each one of the plurality of sensor circuits is configured to convert the signal from the associated one of the plurality of current sensors to a digital current measurement signal and provide the digital current measurement signal to the communication bus;
   a power module configured to be coupled to the input line and the communication bus and to receive input AC power from the input line;
   a collector; and
   a cable configured to be coupled between the power module and the collector;
   wherein the power module comprises:
      an analog interface configured to be coupled to the input line;
      a digital interface configured to be coupled to the communication bus;
      a digital output configured to be coupled to the cable; and
      an AC/DC converter coupled to the analog interface, the digital interface and the digital output and configured to receive the input AC power from the input line, convert the received input AC power into DC power having a desired DC voltage level, and provide the DC power to the communication bus via the digital interface and to the cable via the digital output, and
   wherein the power module is further configured to:
      provide power to the plurality of sensor circuits via the communication bus;
      provide power to the collector via the cable;
      measure at least one of voltage, frequency and phase of the input AC power and provide signals related to the measured voltage, frequency or phase of the input AC power to the collector via the cable;
      receive the digital current measurement signals from the plurality of sensor circuits and provide the received digital current measurement signals to the collector via the cable.

2. The system of claim 1, wherein the power module is further configured to:
   convert the received input AC power into DC power;
   provide the DC power to the plurality of sensor circuits via the communication bus; and
   provide the DC power to the collector via the cable.

3. The system of claim 1, wherein the collector is further configured to be located external the housing of the load center.

4. The system of claim 3, further comprising a terminal configured to pass through the housing of the load center and to allow the cable to pass through the housing of the load center.

5. The system of claim 1, wherein the collector is configured to receive the digital current measurement signals and the signals related to the measured voltage, frequency or phase of the input AC power from the power module via the cable and calculate at least one of power and energy parameters of one of the plurality of circuit branches based on the digital current measurement signals and the signals related to the measured voltage, frequency or phase of the input AC power.

6. The system of claim 1, wherein the power module is further configured to calculate at least one of power and energy parameters of one of the plurality of circuit branches based on the digital current measurement signals and the measured voltage, frequency or phase of the input AC power.

7. The system of claim 6, wherein the digital interface comprises a connector configured to couple with a mating connector at a terminus of the communication bus.

8. The system of claim 6, wherein the analog interface comprises at least one of a terminal block configured to receive the input line and a mechanical strain relief configured to secure the input line to the power module.

9. The system of claim 6, wherein the digital output comprises a mechanical strain relief configured to secure the cable to the power module, and wherein the cable is ruggedized.

10. The system of claim 1, wherein the power module further comprises a voltage sense circuit coupled to the analog interface, the digital interface and the digital output and configured to receive the input AC power from the input line, measure at least one of voltage, frequency and phase of the input AC power and provide signals related to the measured voltage, frequency or phase of the input AC power to the cable.

11. The system of claim 10, further comprising an isolation circuit configured to be coupled to the digital output and configured to prevent high voltage signals from passing between the power module and the cable.

12. The system of claim 1, wherein the plurality of sensor circuits are further configured to utilize a communication protocol to communicate with the power module over the communication bus and the power module is further configured to utilize the communication protocol to communicate with the collector over the cable.

13. The system of claim 1, wherein the power module is further configured to synchronize, via the communication bus, voltage measurements performed by the power module with current measurements performed by at least one of the plurality of sensor circuits.

14. A method for monitoring a plurality of circuit branches coupled to a power line within a load center having a housing, the method comprising:
coupling a current transformer to each one of the plurality of circuit branches;
coupling a plurality of sensor circuits to a communication bus, wherein each sensor circuit of the plurality of sensor circuits is coupled to one of the current transformers;
coupling a power module to the communication bus and a cable;
coupling a collector to the cable;
generating, in each current transformer, a reference signal having a level related to a current level of one of the plurality of circuit branches;
converting, with each of the plurality of sensor circuits, a reference signal from a corresponding current transformer to a digital current measurement signal and providing the digital current measurement signal to the communication bus;
receiving, with the power module, the digital current measurement signal from each sensor circuit via the communication bus;
receiving, with the power module, input AC power from the power line;
converting, with the power module, the received input AC power into DC power;
measuring, with the power module, at least one of voltage, frequency, and phase of the input AC power;
providing, with the power module, power to the plurality of sensor circuits via the communication bus; and
providing, with the power module, power, the received digital current measurement signals from the plurality of sensor circuits, and signals related to the measured at least one of voltage, frequency, and phase of the input AC power to the collector via the cable,
wherein providing power to the plurality of sensor circuits includes providing, with the power module, the DC power to the plurality of sensor circuits via the communication bus; and
wherein providing power, the received digital current measurement signals from the plurality of sensor circuits, and signals related to the measured at least one of voltage, frequency, and phase of the input AC power to the collector via the cable includes providing, with the power module, the DC power, the received digital current measurement signals from the plurality of sensor circuits, and signals related to the measured at least one of voltage, frequency, and phase of the input AC power to the collector via the cable.

15. The method of claim 14, wherein the power module is located within the housing of the load center and the collector is located external the housing of the load center, and wherein the method further comprises threading the cable through a terminal of the housing, the terminal configured to allow the cable to pass through the housing.

16. The method of claim 14, further comprising:
receiving, with the collector, the digital current measurement signals and the signals related to the measured voltage, frequency or phase of the input AC power from the power module via the cable; and
calculating at least one of power and energy parameters of one of the plurality of circuit branches based on the digital current measurement signals and the signals related to the measured voltage, frequency or phase of the input AC power.

17. A system for monitoring a plurality of circuit branches coupled to an input line within a housing of a load center, the system comprising:
a plurality of current sensors, each current sensor of the plurality of current sensors configured to be coupled to at least one of the plurality of circuit branches and to produce a signal having a level related to a current level of the one of the plurality of circuit branches;
a communication bus;
a plurality of sensor circuits, each coupled to an associated one of the plurality of current sensors and configured to be coupled to the communication bus, wherein each one of the plurality of sensor circuits is configured to convert the signal from the associated one of the plurality of current sensors to a digital current measurement signal and provide the digital current measurement signal to the communication bus;
a collector located external the housing; and
means for receiving input AC power from the input line, measuring at least one of voltage, phase, and frequency of the input AC power on the input line, converting the input AC power to DC power having a desired DC voltage level, providing the DC power to the plurality of sensor circuits via the communication bus, providing the DC power to the collector via a single cable, and providing signals related to the at least one of voltage, phase, and frequency of the input AC power, the digital current measurement signals from the plurality of sensor circuits, and the DC power to the collector via the single cable.

18. The system of claim 17, further comprising means for preventing high voltage signals from being provided to the single cable.

* * * * *